(12) United States Patent
Ikeda et al.

(10) Patent No.: US 9,236,373 B2
(45) Date of Patent: Jan. 12, 2016

(54) SEMICONDUCTOR DEVICE

(71) Applicant: Kabushiki Kaisha Toshiba, Minato-ku (JP)

(72) Inventors: Kentaro Ikeda, Kawasaki (JP); Hiroshi Mochikawa, Hachioji (JP); Atsuhiko Kuzumaki, Kodaira (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/625,139

(22) Filed: Feb. 18, 2015

(65) Prior Publication Data

US 2015/0270255 A1    Sep. 24, 2015

(30) Foreign Application Priority Data

Mar. 20, 2014 (JP) .................. 2014-059199

(51) Int. Cl.

| | |
|---|---|
| *H01L 23/60* | (2006.01) |
| *H01L 27/02* | (2006.01) |
| *H01L 27/06* | (2006.01) |
| *H01L 29/866* | (2006.01) |
| *H01L 29/778* | (2006.01) |
| *H01L 29/20* | (2006.01) |
| *H01L 29/80* | (2006.01) |
| *H01L 29/16* | (2006.01) |

(52) U.S. Cl.
CPC ........ *H01L 27/0255* (2013.01); *H01L 27/0629* (2013.01); *H01L 29/1608* (2013.01); *H01L 29/2003* (2013.01); *H01L 29/7786* (2013.01); *H01L 29/80* (2013.01); *H01L 29/866* (2013.01)

(58) Field of Classification Search
CPC .................. H01L 27/0248; H01L 27/0292
USPC ......................... 257/173, 328, 360
See application file for complete search history.

(56) References Cited

U.S. PATENT DOCUMENTS

| | | | |
|---|---|---|---|
| 7,719,806 B1 * | 5/2010 | Boyd .................... | H01L 27/027 361/56 |
| 2011/0199148 A1 | 8/2011 | Iwamura | |
| 2012/0241756 A1 | 9/2012 | Zhang et al. | |

FOREIGN PATENT DOCUMENTS

| | | | |
|---|---|---|---|
| JP | 2004-032893 A | | 1/2004 |
| JP | 2006-324839 A | | 11/2006 |
| JP | 2011-166673 A | | 8/2011 |
| JP | 2012-199547 A | | 10/2012 |
| JP | 2012199547 A | * | 10/2012 |
| JP | 2012-212875 A | | 11/2012 |

* cited by examiner

*Primary Examiner* — Brook Kebede
(74) *Attorney, Agent, or Firm* — Oblon, McClelland, Maier & Neustadt, L.L.P.

(57) ABSTRACT

A semiconductor device according to the embodiments includes: a first normally-off transistor including a first source terminal, a first drain terminal, and a first gate terminal; a normally-on transistor including a second source terminal connected to the first drain terminal, a second drain terminal, and a second gate terminal connected to the first source terminal; a protection element provided between the first gate terminal and the second drain terminal, and having breakdown voltage lower than breakdown voltage of the normally-on transistor; and a first diode including a first anode connected to the second drain terminal and a first cathode connected to the protection element.

16 Claims, 20 Drawing Sheets

SEMICONDUCTOR DEVICE

CROSS-REFERENCE TO RELATED APPLICATION

This application is based upon and claims the benefit of priority from Japanese Patent Application No. 2014-059199, filed on Mar. 20, 2014, the entire contents of which are incorporated herein by reference.

FIELD

Embodiments described herein relate generally to a semiconductor device.

BACKGROUND

Group III nitride semiconductor, e.g., GaN (gallium nitride) semiconductor, has been expected as a material for a next-generation semiconductor device. GaN semiconductor device has wider bandgap than Si (silicon), and can attain higher breakdown voltage and lower loss than a Si semiconductor device.

A GaN semiconductor transistor generally has an HEMT (High Electron Mobility Transistor) structure using two-dimensional electron gas (2 DEG) as a carrier. A normal HEMT is a normally-on transistor that becomes conductive even if voltage is not applied to a gate. Therefore, there arises a problem in which it is difficult to implement a normally-off transistor that becomes conductive only when voltage is applied to a gate.

A power supply circuit that processes vast amounts of power such as hundreds to one thousand volts is required to have a normally-off operation with an emphasis on safety. In light of this, a circuit structure attaining a normally-off operation by a cascade connection between a normally-on GaN semiconductor transistor and a normally-off Si transistor has been proposed.

A GaN semiconductor transistor has small avalanche resistance, so that it might be broken due to serge voltage. The circuit structure using the cascade connection also has a problem of deterioration in reliability, because it has low resistance to serge voltage.

DETAILED DESCRIPTION

Figure 1:
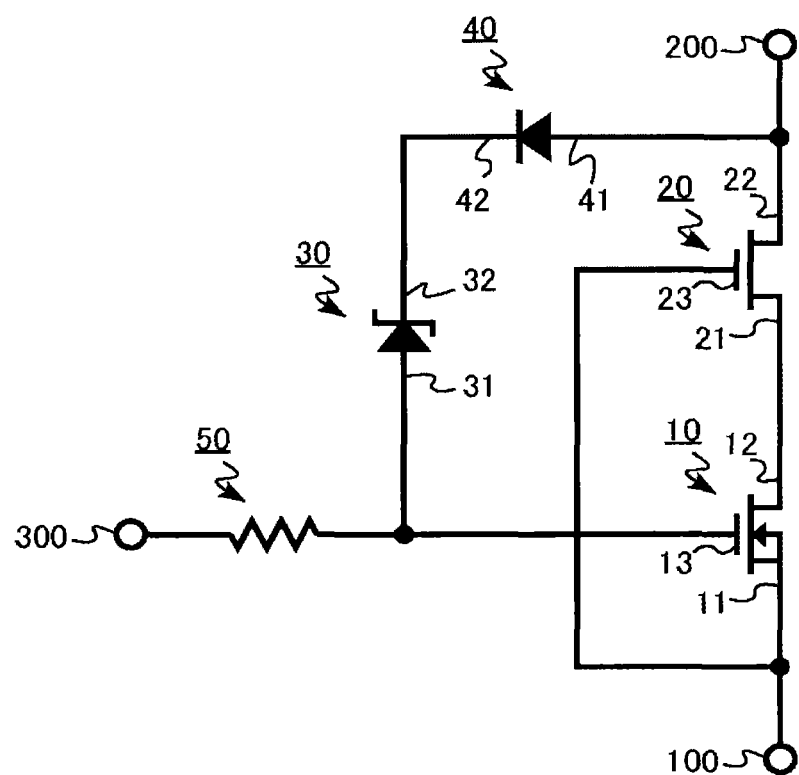
FIG. 1 is a circuit diagram of a semiconductor device according to a first embodiment.

A semiconductor device according to the embodiments includes: a first normally-off transistor including a first source terminal, a first drain terminal, and a first gate terminal; a normally-on transistor including a second source terminal connected to the first drain terminal, a second drain terminal, and a second gate terminal connected to the first source terminal; a protection element provided between the first gate terminal and the second drain terminal, and having breakdown voltage lower than breakdown voltage of the normally-on transistor; and a first diode including a first anode connected to the second drain terminal and a first cathode connected to the protection element.

The embodiments of the present disclosure will be described below with reference to the drawings. In the description below, the same components are identified by the same reference numerals, and the description for the component once described before will not be repeated accordingly.

In the present specification, a semiconductor device is a concept including a power module in which plural elements such as discrete semiconductor are combined; an intelligent module in which drive circuits for driving plural elements such as discrete semiconductor and a self-protection function are incorporated into these plural elements; or a system including a power module and an intelligent power module.

In the present specification, "GaN semiconductor" is a collective term indicating semiconductor including GaN (gallium nitride), AlN (aluminum nitride), InN (indium nitride), and their intermediate compositions.

First Embodiment

A semiconductor device according to the present embodiment includes: a first normally-off transistor including a first source terminal, a first drain terminal, and a first gate terminal; a normally-on transistor including a second source terminal connected to the first drain terminal, a second drain terminal, and a second gate terminal connected to the first source terminal; a protection element provided between the first gate terminal and the second drain terminal, and having breakdown voltage lower than breakdown voltage of the normally-on transistor; and a first diode including a first anode connected to the second drain terminal and a first cathode connected to the protection element.

FIG. 1 is a circuit diagram of a semiconductor device according to the present embodiment. The semiconductor device according to the present embodiment is a power module with rated voltage of 600 V or 1200 V, for example.

In the semiconductor device according to the present embodiment, a normally-off transistor (first normally-off transistor) 10 and a normally-on transistor 20 are connected in series to form a power module. The normally-off transistor 10 is, for example, a Si (silicon) vertical MOSFET (Metal Oxide Semiconductor Field Effect Transistor). The normally-on transistor 20 is, for example, an HEMT of GaN (gallium nitride) semiconductor. The normally-on transistor 20 has a gate insulating film.

The normally-off transistor 10 has lower breakdown voltage than the normally-on transistor 20. The breakdown voltage of the normally-off transistor 10 is, for example, 10 to 30 V. The breakdown voltage of the normally-on transistor 20 is, for example, 100 to 1200 V.

The semiconductor device includes a source electrode terminal 100, a drain electrode terminal 200, and a gate electrode terminal 300. The normally-off transistor 10 includes a first source terminal 11 connected to the source electrode terminal 100, a first drain terminal 12, and a first gate terminal 13 connected to the gate electrode terminal 300. The normally-on transistor 20 includes a second source terminal 21 connected to the first drain terminal 12, a second drain terminal 22 connected to the drain electrode terminal 200, and a second gate terminal 23 connected to the first source terminal 11.

The semiconductor device also includes a zener diode (protection element: second diode) 30, a PN diode (first diode) 40, and a first resistance element 50.

The zener diode (second diode) 30 includes an anode (second anode) 31 and a cathode (second cathode) 32. The PN diode (first diode) 40 includes an anode (first anode) 41 and a cathode (first cathode) 42.

One end of the first resistance element 50 is connected to the gate electrode terminal 300. The other end of the resistance element 50 is connected to the anode 31 of the zener diode 30 and the first gate terminal 13 of the normally-off transistor 10.

The anode 31 of the zener diode 30 is connected to the first gate terminal 13 of the normally-off transistor 10 and the first resistance element 50. The cathode 32 of the zener diode 30 is connected to the cathode 42 of the PN diode 40. Specifically, the zener diode 30 is connected such that the direction toward the second drain terminal 22 from the first gate terminal 13 and the gate electrode terminal 300 becomes a forward direction.

The first anode 41 of the PN diode 40 is connected to the second drain terminal 22 of the normally-on transistor 20. Specifically, the PN diode 40 is connected such that the direction toward the first gate terminal 13 and the gate electrode terminal 300 from the second drain terminal 22 becomes a forward direction.

Zener voltage (breakdown voltage) of the zener diode 30 is lower than breakdown voltage of the normally-on transistor 20. The zener diode 30 has a function of allowing current to flow through the first gate terminal 13 from the second drain terminal 22 by being conductive in the opposite direction with the voltage lower than the breakdown voltage of the normally-on transistor 20.

The semiconductor device according to the present embodiment has the structure described above, so that it equivalently functions as a normally-off transistor including the source electrode terminal 100, the drain electrode terminal 200, and the gate electrode terminal 300. The zener diode (protection element: second diode) 30, the PN diode (first diode) 40, and the first resistance element 50 function as a protection circuit for preventing breakdown of the semiconductor device, when serge voltage is generated on the semiconductor device.

Firstly, the normal operation of the semiconductor device according to the present embodiment will be described.

In an on state, 0 V is applied to the source electrode terminal 100, and positive voltage, e.g., a product of on resistance and drain current, is applied to the drain electrode terminal 200. Positive voltage, e.g., 10 V, is applied to the gate electrode terminal 300.

In this case, positive voltage is applied to the first gate terminal 13 of the normally-off transistor 10. Therefore, the normally-off transistor 10 is turned on.

On the other hand, the second gate terminal 23 of the normally-on transistor 20 is clamped by the source electrode terminal 100. Therefore, the second gate terminal 23 becomes 0 V. The second source terminal 21 has a potential around 0 V, since the normally-off transistor 10 is turned on. Therefore, the normally-on transistor 20 is also turned on. Accordingly, on current flows through a main circuit between the source electrode terminal 100 and the drain electrode terminal 200.

Next, the case where the semiconductor device is changed from its on state to its off state will be supposed. In this case, applied voltage of the source electrode terminal 100 and the drain electrode terminal 200 is not changed, but the applied voltage of the gate electrode terminal 300 is decreased to 0 V from positive voltage, e.g., decreased to 0 V from 10 V.

Firstly, 0 V is applied to the first gate terminal 13 of the normally-off transistor 10. With this, the normally-off transistor 10 is turned off. Thereafter, the voltage of the second source terminal 21 continuously increases, and when the potential difference between the second gate terminal 23 clamped to 0 V and the second source terminal 21 reaches a threshold value (negative value), the normally-on transistor 20 is turned off. Accordingly, the current between the source electrode terminal 100 and the drain electrode terminal 200 is cut off.

In this way, the semiconductor device according to the present embodiment equivalently functions as a normally-off transistor including the source electrode terminal 100, the drain electrode terminal 200, and the gate electrode terminal 300.

An operation of the protection circuit in the semiconductor device according to the embodiment in the case where serge voltage is generated will be described next. The function and effect of the semiconductor device according to the present embodiment will also be described.

Figure 2:
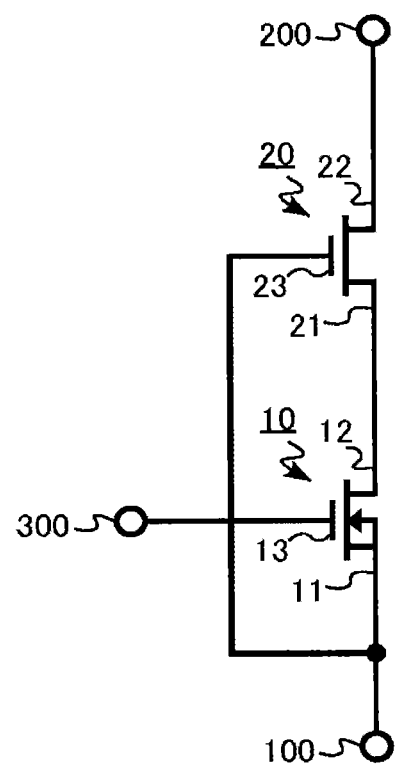
FIG. 2 is a circuit diagram of a semiconductor device according to a comparative example.

FIG. 2 is a circuit diagram of a semiconductor device according to a comparative example. The semiconductor device according to the comparative example is different from the semiconductor device according to the present embodiment in that the semiconductor device according to the comparative example does not have the protection circuit.

It is supposed, for example, that 0 V is applied to a gate electrode terminal 300 of the semiconductor device according to the comparative example, so that a normally-off transistor 10 is turned off, and a main circuit between a source electrode terminal 100 and a drain electrode terminal 200 is off. When an inductive load such as a motor connected to the drain electrode terminal 200 of the transistor is driven with this state, serge voltage exceeding a steady state might instantaneously be generated on the drain electrode terminal 200.

When the serge voltage applied to the drain electrode terminal 200 exceeds the breakdown voltage of the normally-on transistor 20, breakdown of the normally-on transistor 20 occurs. The GaN semiconductor normally-on transistor 20 having less resistance to serge might be broken due to an occurrence of breakdown.

The semiconductor device according to the present embodiment illustrated in FIG. 1 includes the protection circuit including the zener diode 30, the PN diode 40, and the first resistance element 50. In the present embodiment, when serge voltage is applied to the drain electrode terminal 200 upon the off state of the normally-off transistor 10, current flows toward the first gate terminal 13 of the normally-off transistor 10 via the PN diode 40 and the zener diode 30 before the potential of the second drain terminal 22 exceeds the breakdown voltage of the normally-on transistor 20. The reason of this is that the zener voltage (breakdown voltage) of the zener diode 30 is set lower than the breakdown voltage of the normally-on transistor 20.

When current is flown into the first gate terminal 13 of the normally-off transistor 10, the gate voltage of the normally-off transistor 10 increases. Therefore, the normally-off transistor 10 is turned on, the voltage of the second source terminal 21 of the normally-on transistor 20 decreases, and the normally-on transistor 20 is turned on.

Accordingly, energy of the serge voltage can be absorbed by the conduction of the main circuit before the normally-on transistor 20 is broken down. This can prevent the normally-on transistor 20 from being broken down to suppress the breakdown of the normally-on transistor 20 upon the occurrence of serge voltage.

Figure 3:
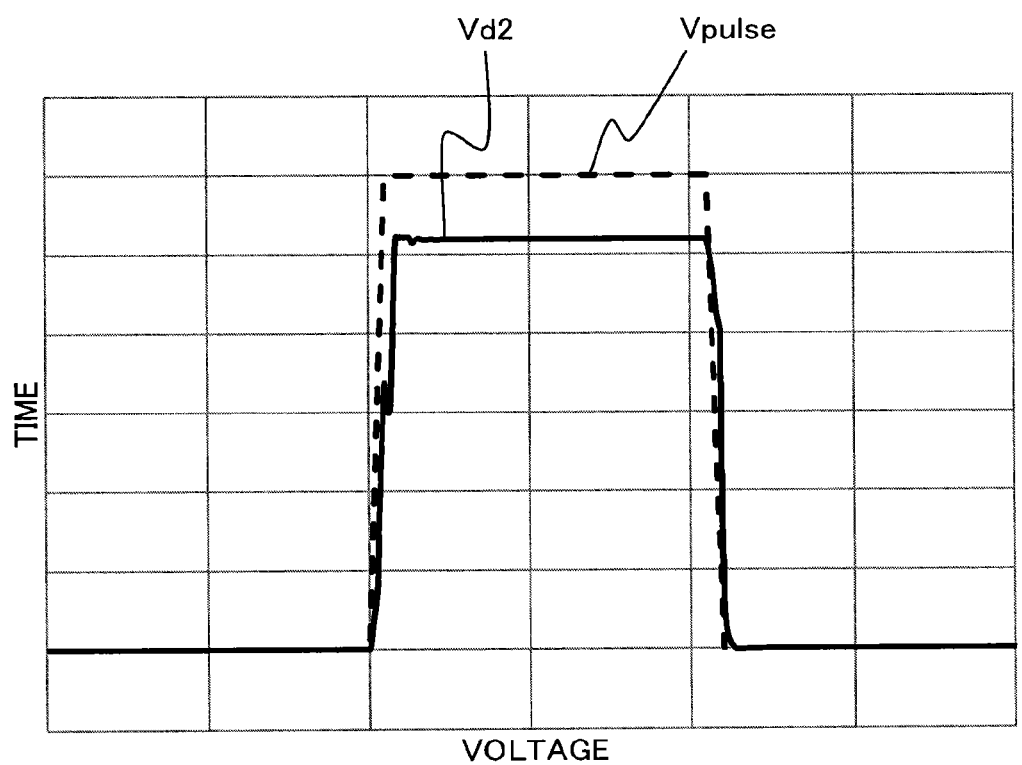
FIG. 3 is an explanatory view for describing an effect of the semiconductor device according to the first embodiment.

FIG. 3 is a diagram for describing an effect of the semiconductor device according to the present embodiment. FIG. 3 illustrates a simulation result when pulse voltage simulating serge voltage is applied to the drain electrode terminal 200 in the circuit structure in FIG. 1. In FIG. 3, Vpulse represents pulse voltage applied to the drain electrode terminal 200, and Vd2 represents voltage of the second drain terminal 22 of the normally-on transistor 20.

As illustrated in FIG. 3, the voltage Vd2 of the second drain terminal 22 is lower than the pulse voltage Vpulse, which verifies the effect of the present embodiment.

In the protection circuit according to the present embodiment, the first resistance element 50 prevents current from excessively flowing through the gate electrode terminal 300 when current flows toward the gate electrode terminal 300 from the second drain terminal 22 of the normally-on transistor 20. When current is excessively flown through the gate electrode terminal 300, the gate voltage of the normally-off transistor 10 might not sufficiently be increased.

Figure 4:
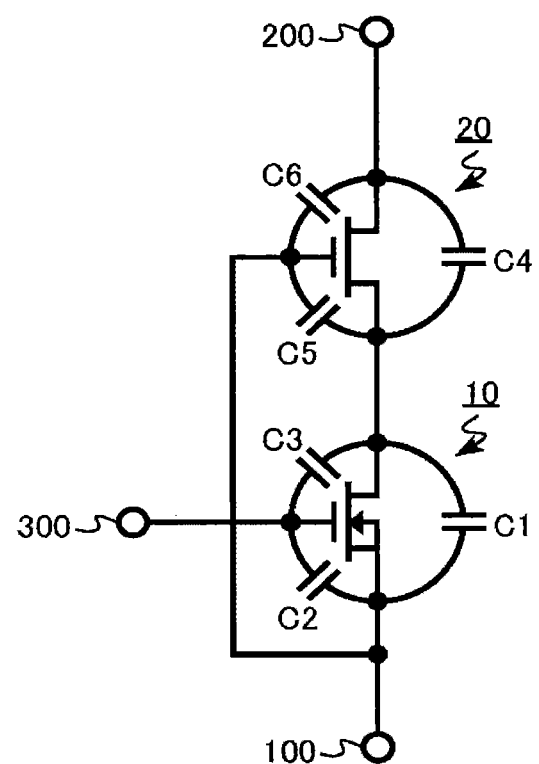
FIG. 4 is a circuit diagram illustrating parasitic capacitance of the semiconductor device according to the comparative example.

FIG. 4 is a circuit diagram illustrating parasitic capacitance of the semiconductor device according to the comparative example. FIG. 4 illustrates parasitic capacitance of a circuit including a cascade connection between the normally-off transistor 10 and the normally-on transistor 20.

The cascade connection has an inherent problem in which the normally-off transistor 10 is broken due to an occurrence of excess voltage on the drain of the normally-off transistor 10. As illustrated in FIG. 4, in the circuit having the cascade connection of the normally-off transistor 10 and the normally-on transistor 20, parasitic capacitances of the normally-off transistor 10 and the normally-on transistor 20 are distributed as indicated by C1 to C6.

When the parasitic capacitances C1 to C6 are combined, excess voltage corresponding to the voltage of the gate electrode terminal 300 is generated on the drain of the normally-off transistor 10 upon the off state of the main circuit due to electrostatic induction. Since the breakdown voltage of the normally-off transistor 10 is lower than the breakdown voltage of the normally-on transistor 20, the normally-off transistor 10 might be broken due to excess voltage.

The GaN semiconductor transistor also has an inherent problem of a phenomenon in which on resistance is increased. This phenomenon is called current collapse. The current collapse is caused by application of excessive drain voltage or gate voltage.

When excess voltage is generated on the drain of the normally-off transistor 10, high voltage is applied between the source and the gate of the normally-on transistor 20. Therefore, the current collapse is likely to occur.

When serge voltage is applied to the drain electrode terminal 200, excess voltage higher than expected during a normal operation is generated on the drain of the normally-off transistor 10. The semiconductor device according to the present embodiment has the protection circuit, thereby being capable of suppressing excess voltage generated on the drain of the normally-off transistor 10.

Figure 5:
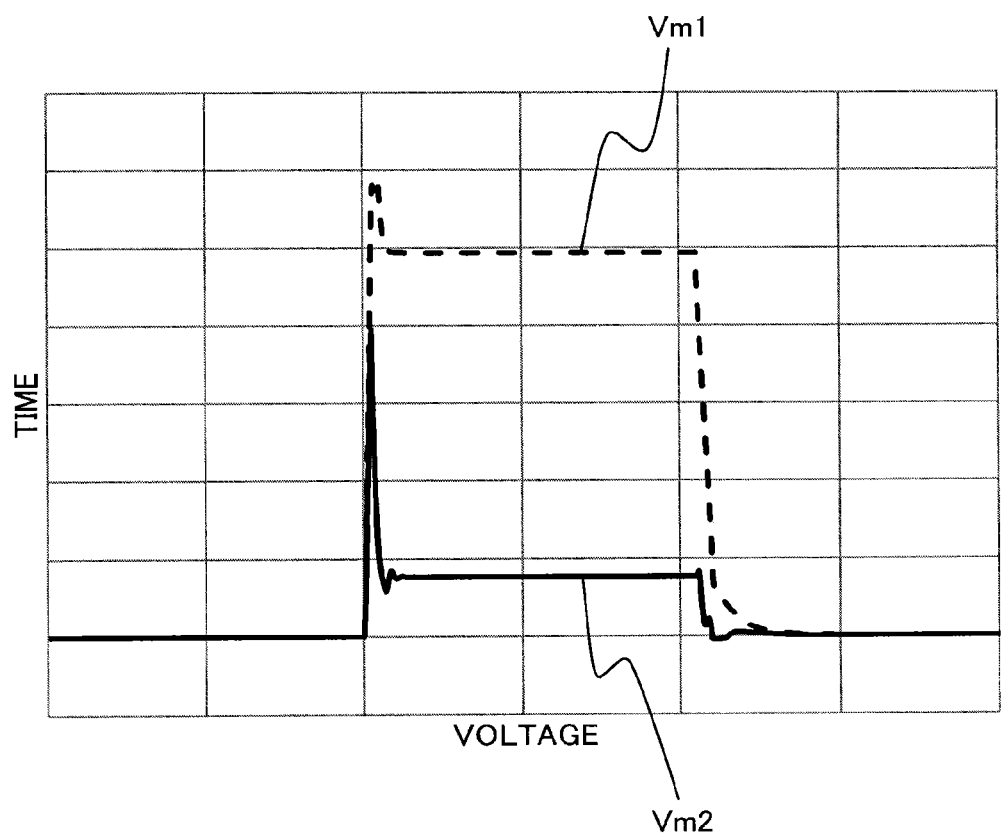
FIG. 5 is an explanatory view for describing the effect of the semiconductor device according to the first embodiment.

FIG. 5 is a diagram illustrating the effect of the semiconductor device according to the present embodiment. FIG. 5 illustrates a simulation result when pulse voltage simulating serge voltage is applied to the drain electrode terminal 200 in the circuit structure of the present embodiment and the circuit structure of the comparative example. In FIG. 5, Vm1 represents drain voltage of the normally-off transistor 10 in the comparative example (FIG. 2), and Vm2 represents drain voltage of the normally-off transistor 10 in the present embodiment (FIG. 1).

As illustrated in FIG. 5, it is confirmed that excess voltage generated on the drain of the normally-off transistor 10 is suppressed more in the present embodiment than in the comparative example.

The PN diode 40 is connected to have reverse bias in the normal operation in which on voltage is applied to the gate electrode terminal 300. The breakdown voltage of the PN diode (first diode) 40 is higher than the maximum voltage applied to the gate electrode terminal 300 upon the on state of the main circuit.

When the main circuit is on, the voltage of the drain electrode terminal 200 is decreased. The formation of the PN diode 40 can reduce current flowing between the gate electrode terminal 300 and the drain electrode terminal 200 to suppress an increase in power consumption upon the on state of the main circuit.

The breakdown voltage of the PN diode (first diode) 40 is desirably higher than the breakdown voltage of the normally-on transistor 20.

When voltage is applied to the drain electrode terminal 200 during the normal operation of the semiconductor device according to the present embodiment, charges are accumulated between the zener diode 30 and the PN diode 40. When the main circuit is then turned on, and the potential of the drain electrode terminal 200 is reduced to nearly 0 V, for example, voltage almost equal to the voltage applied to the drain electrode terminal 200 is applied to the PN diode 40 as reverse bias.

Figure 6:
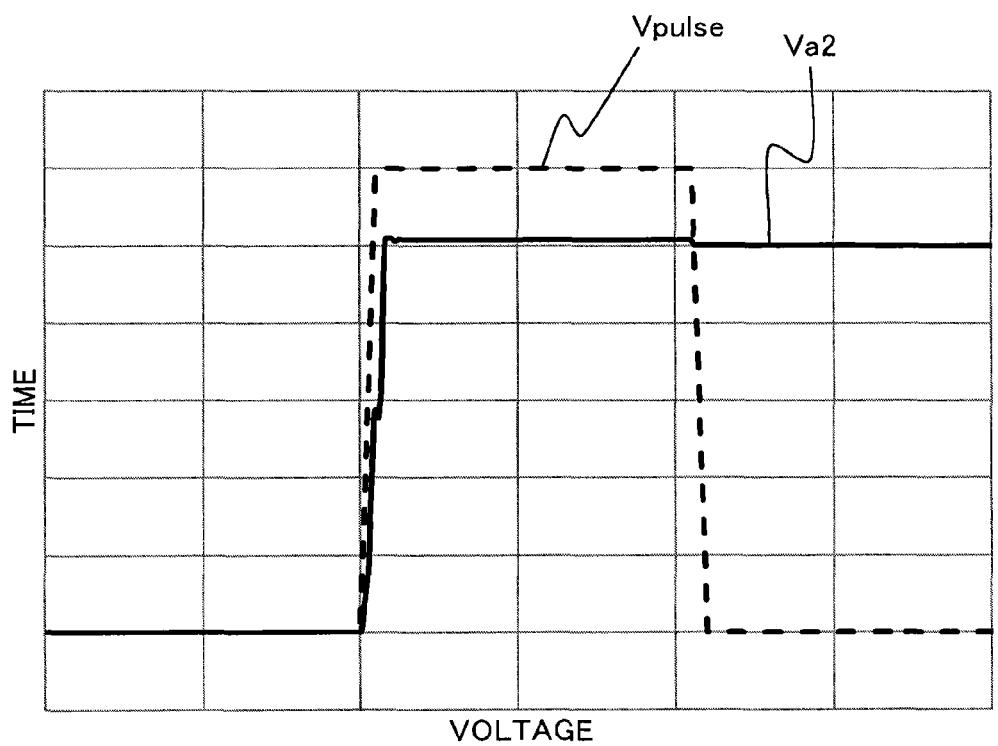
FIG. 6 is an explanatory view for describing the effect of the semiconductor device according to the first embodiment.

FIG. 6 is a diagram for describing an effect of the semiconductor device according to the present embodiment. FIG. 6 illustrates a simulation result in which pulse voltage simulating voltage of the drain electrode terminal 200 during the normal operation of the drain electrode terminal 200 is applied in the circuit structure in FIG. 1.

In FIG. 6, Vpulse represents pulse voltage applied to the drain electrode terminal 200, and Va2 represents voltage of the cathode 42 of the PN diode 40. In other words, Va2 represents voltage between the zener diode 30 and the PN diode 40. As understood from FIG. 6, voltage remains on the cathode 42 even if the pulse voltage Vpulse is lost.

If the breakdown voltage of the PN diode 40 is equal to or lower than the breakdown voltage of the normally-on transistor 20, the PN diode 40 might be broken due to the remaining voltage. This results in the restriction of the breakdown voltage of the whole semiconductor device by the breakdown voltage of the PN diode 40. When the breakdown voltage of the PN diode (first diode) 40 is set higher than the breakdown voltage of the normally-on transistor 20, the breakdown voltage of the whole semiconductor device is surely specified by the breakdown voltage of the normally-on transistor 20 as designed.

The present embodiment employs a zener diode as the second diode serving as a protection element, as one example. The zener diode has breakdown voltage ensured as zener voltage with high accuracy, and the operation of the zener diode after the breakdown is also assured. Thus, the zener diode is desirable for the protection element.

However, a diode other than the zener diode, such as a PN diode, a PIN diode, or a Schottky barrier diode, may be used as the second diode serving as a protection element. When a diode other than the zener diode is used, this diode is desirably ensured to perform avalanche operation.

The present embodiment uses the PN diode as the first diode provided between the second drain terminal 22 and the protection element as one example. However, other diodes, such as a PIN diode and a Schottky barrier diode, can be used as the first diode.

The plural first diodes or the plural second diodes can be connected in series.

As described above, according to the present embodiment, the protection circuit is formed, whereby a semiconductor device having increased resistance to serge voltage and enhanced reliability can be realized.

Second Embodiment

A semiconductor device according to the present embodiment is similar to that in the first embodiment except that the first diode is a zener diode. Therefore, the description overlapping with the first embodiment will not be repeated.

Figure 7:
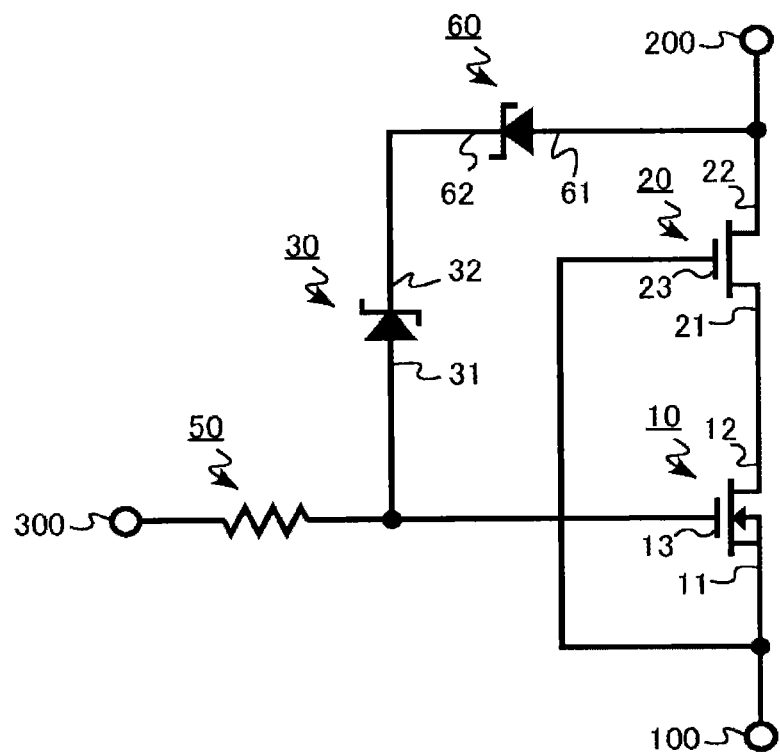
FIG. 7 is a circuit diagram of a semiconductor device according to a second embodiment.

FIG. 7 is a circuit diagram of a semiconductor device according to the present embodiment. In the semiconductor device according to the present embodiment, the first diode is a zener diode 60. The zener diode (first diode) 60 includes an anode (first anode) 61 and a cathode (first cathode) 62.

Zener voltage of the zener diode (first diode) 60 is higher than the maximum voltage applied to the gate electrode terminal 300 upon an on state of a main circuit. This can reduce current flowing between the gate electrode terminal 300 and the drain electrode terminal 200 to suppress an increase in power consumption upon the on state of the main circuit.

When voltage is applied to the drain electrode terminal 200 during the normal operation of the semiconductor device according to the present embodiment, charges are accumulated between the zener diode 30 and the zener diode 60, so that reverse bias is applied to the zener diode 60. However, voltage higher than the zener voltage of the zener diode 60 is released to the drain electrode terminal 200, whereby a high voltage state between the zener diode 30 and the zener diode 60 is eased.

Figure 8:
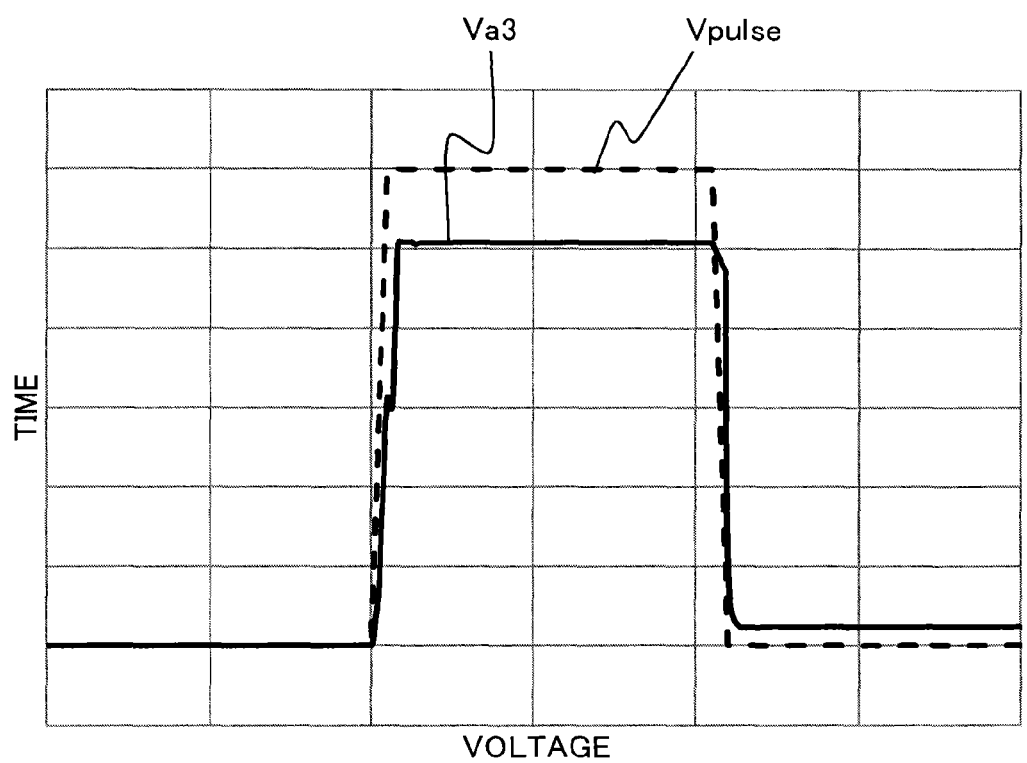
FIG. 8 is an explanatory view for describing an effect of the semiconductor device according to the second embodiment.

FIG. 8 is a diagram for describing an effect of the semiconductor device according to the present embodiment. FIG. 8 illustrates a simulation result in which pulse voltage simulating voltage of the drain electrode terminal 200 during the normal operation of the drain electrode terminal 200 is applied in the circuit structure in FIG. 7.

In FIG. 8, Vpulse represents pulse voltage applied to the drain electrode terminal 200, and Va3 represents voltage of the cathode 62 of the zener diode 60. In other words, Va3 represents voltage between the zener diode 30 and the zener diode 60. As understood from FIG. 8, voltage of the cathode 62 is decreased to the zener voltage when the pulse voltage Vpulse is lost.

The zener voltage of the zener diode 60 is not required to be higher than necessary. The zener voltage is 5 V or more but 40 V or less, for example. Accordingly, the protection circuit can be realized with low cost.

As described above, according to the present embodiment, the protection circuit is formed, whereby a semiconductor device having increased resistance to serge voltage and enhanced reliability can be realized. In addition, the protection circuit can be realized with low cost by employing a zener diode for the first diode.

Third Embodiment

A semiconductor device according to the present embodiment is similar to that in the first embodiment except that the protection element is a normally-off transistor. Therefore, the description overlapping with the first embodiment will not be repeated.

Figure 9:
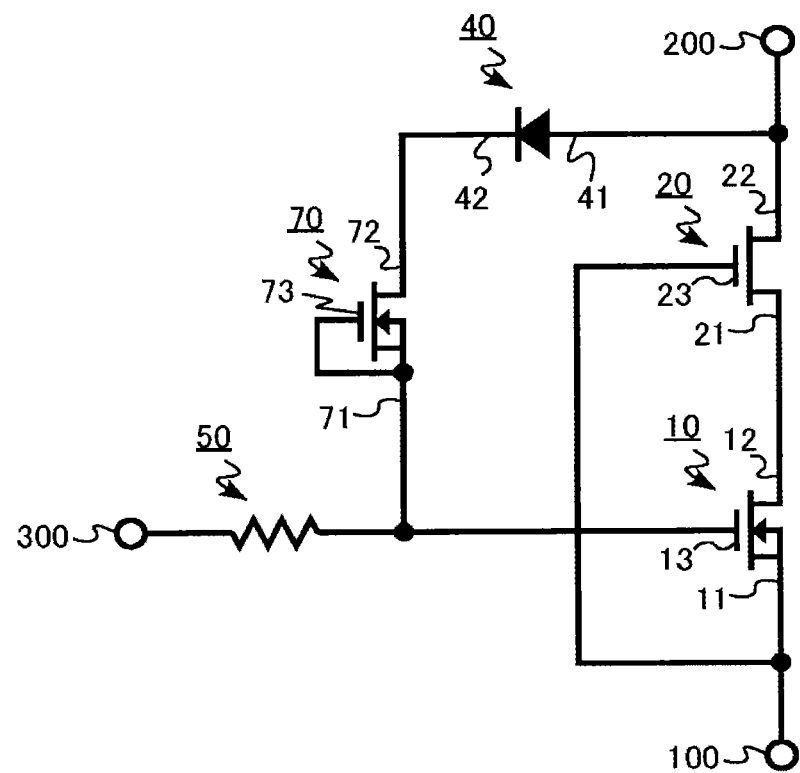
FIG. 9 is a circuit diagram of a semiconductor device according to a third embodiment.

FIG. 9 is a circuit diagram of a semiconductor device according to the present embodiment. In the semiconductor device according to the present embodiment, the protection element is a normally-off transistor (second normally-off transistor) 70.

The normally-off transistor (protection element: second normally-off transistor) 70 includes a third source terminal 71, a third drain 72, and a third gate terminal 73. The third source terminal 71 is connected to one end of a first resistance element 50 and a first gate terminal 13 of a normally-off transistor 10. The third drain 72 is connected to a cathode 42 of a PN diode 40. The third source terminal 71 and the third gate terminal 73 are short-circuited.

The breakdown voltage of the normally-off transistor 70 is lower than the breakdown voltage of a normally-on transistor 20. The normally-off transistor 70 has a function of allowing current to flow through the first gate terminal 13 from the second drain terminal 22 by being conductive in the opposite direction with the voltage lower than the breakdown voltage of the normally-on transistor 20.

The normally-off transistor 70 is a Si (silicon) MOSFET, for example. The normally-off transistor 70 may be a transistor with smaller current rating than the normally-off transistor 10 or the normally-on transistor 20.

There are various types of Si MOSFETs having various breakdown voltages or various current capacity. Therefore, the present embodiment increases a degree of freedom of circuit design.

For example, there is a Si MOSFET having breakdown voltage of 900 V or higher. Therefore, a normally-on transistor 20 having breakdown voltage of 900 V can be selected relative to the normally-on transistor 20 having breakdown voltage of 1 kV. In addition, capacitance of the normally-off transistor 70 can freely be selected according to supposed serge energy.

In addition, plural normally-off transistors 70 can be connected in series for adjusting breakdown voltage.

As described above, according to the present embodiment, the protection circuit is formed, whereby a semiconductor device having increased resistance to serge voltage and enhanced reliability can be realized. In addition, a normally-off transistor is used for the protection element, whereby a degree of freedom of circuit design is enhanced.

Fourth Embodiment

A semiconductor device according to the present embodiment is similar to that in the first embodiment except for further including a third anode connected to a first source terminal of a normally-off transistor and a third cathode connected to a first drain terminal. Therefore, the description overlapping with the first embodiment will not be repeated.

Figure 10:
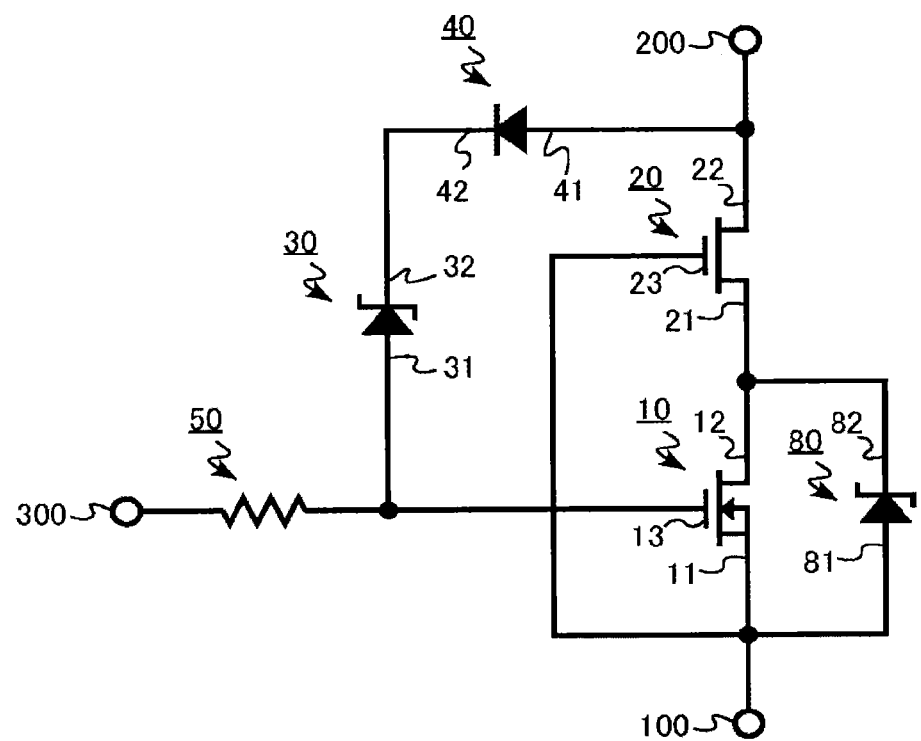
FIG. 10 is a circuit diagram of a semiconductor device according to a fourth embodiment.

FIG. 10 is a circuit diagram of a semiconductor device according to the present embodiment. The semiconductor device according to the present embodiment includes a zener diode 80. The zener diode 80 includes an anode (third anode) 81 and a cathode (third cathode) 82. The anode (third anode) 81 is connected to a first source terminal 11 of a normally-off transistor 10. The cathode (third cathode) 82 is connected to a first drain terminal 12 of the normally-off transistor 10.

Zener voltage of the zener diode 80 is equal to or higher than a threshold value of a normally-on transistor 20 from the viewpoint of turning the main circuit off. The zener voltage of the zener diode 80 is also equal to or lower than breakdown voltage between a source and a drain of the normally-on transistor 20, and equal to or lower than breakdown voltage of the normally-off transistor 10.

When excess voltage is generated on the first drain terminal 12 of the normally-off transistor 10, charges can be released to the source electrode terminal 100 in the zener diode 80. Accordingly, this can further prevent the normally-off transistor 10 from being broken due to excess voltage.

As described above, according to the present embodiment, the protection circuit is formed, whereby a semiconductor device having increased resistance to serge voltage and enhanced reliability can be realized. In addition, when excess voltage is generated on the drain of the normally-off transistor, charges can be released, whereby reliability is further enhanced.

Fifth Embodiment

A semiconductor device according to the present embodiment is similar to that in the first embodiment except that the semiconductor device according to the present embodiment further includes a gate driver circuit having an output unit connected to a first resistance element and an input unit connected to a first gate terminal and a protection element. Therefore, the description overlapping with the first embodiment will not be repeated.

Figure 11:
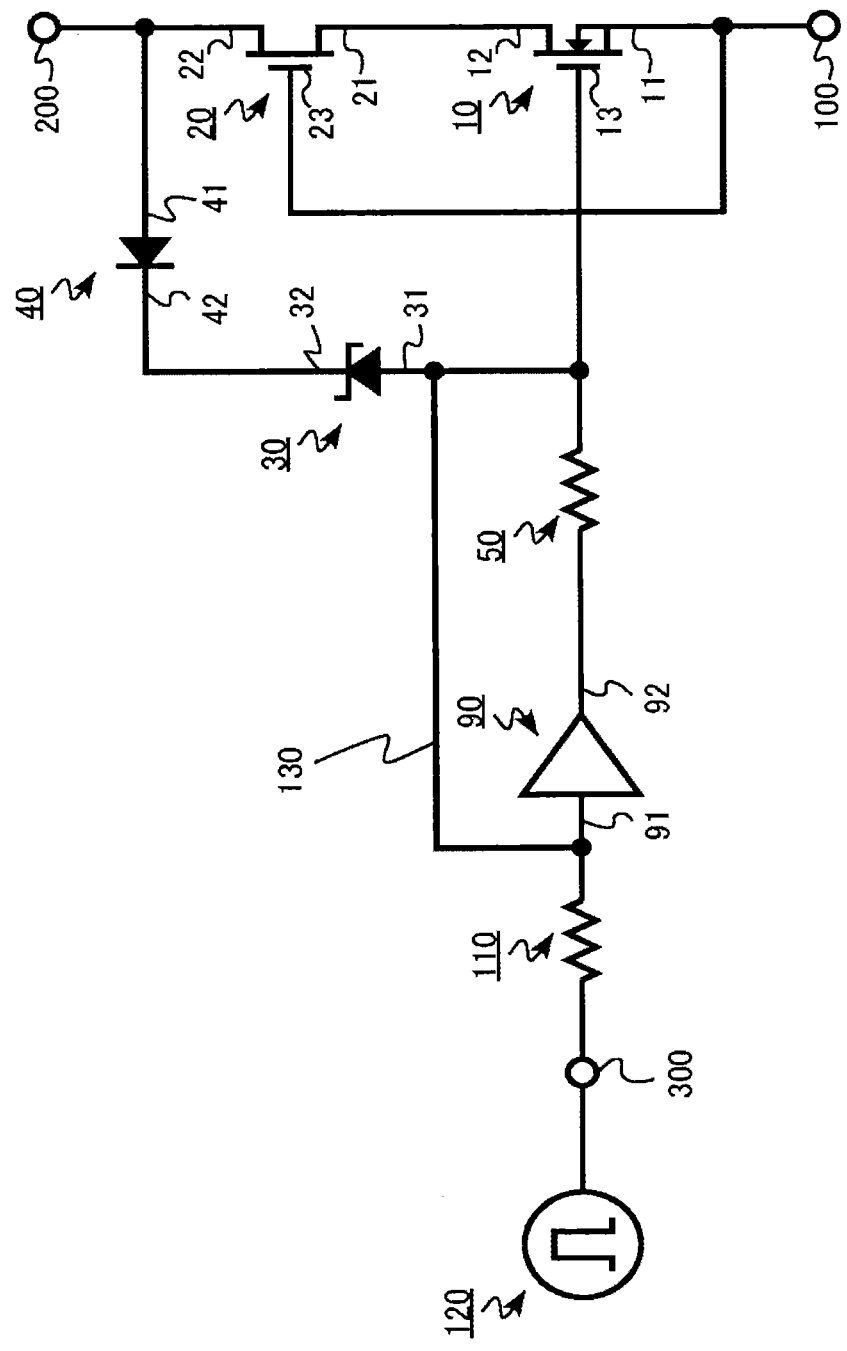
FIG. 11 is a circuit diagram of a semiconductor device according to a fifth embodiment.

FIG. 11 is a circuit diagram of a semiconductor device according to the present embodiment. The semiconductor device according to the present embodiment is a power module with rated voltage of 600 V or 1200 V.

The semiconductor device according to the present embodiment includes a gate driver circuit 90 and a second resistance element 110.

The gate driver circuit 90 includes an input unit 91 and an output unit 92. A gate electrode terminal 300 is connected to a gate signal input unit 120, and the gate electrode terminal 300 is connected to the input unit 91 of the gate driver circuit 90.

The second resistance element 110 is provided between the gate electrode terminal 300 and the gate driver circuit 90. One end of the second resistance element 110 is connected to the gate electrode terminal 300, while the other end is connected to the input unit 91 of the gate driver circuit 90.

The second resistance element 110 is a so-called damping element having a function of suppressing wringing. The second resistance element 110 has resistance higher than the first resistance element 50.

The output unit 92 of the gate driver circuit 90 is connected to the first resistance element 50. The first gate terminal 13 and the protection element 30 are connected to the input unit 91 of the gate driver circuit 90 by a bypass line 130. The second resistance element 110 is connected to the first gate terminal 13 and the protection element 30 by the bypass line 130.

The semiconductor device according to the embodiment equivalently functions as a normally-off transistor including the source electrode terminal 100, the drain electrode terminal 200, and the gate electrode terminal 300.

A circuit other than the gate driver circuit 90, such as a level shift circuit, may be provided between the gate electrode terminal 300 and the first resistance element 50.

As described above, when current flows toward the gate electrode terminal 300 from the second drain terminal 22 of the normally-on transistor 20, the first resistance element 50 prevents current from excessively flowing into the gate electrode terminal 300. However, when the resistance of the first resistance element 50 becomes too high, a switching loss of the semiconductor device increases.

In the present embodiment, serge voltage is applied to the former stage of the gate driver circuit 90, i.e., to the side of the input unit 91, through the bypass line 130. With this, a gate control signal (off signal) applied from the gate signal input unit 120 is inverted, so that the on signal is inputted to the gate driver circuit 90. Accordingly, the normally-off transistor 10 is turned on, whereby the break of the normally-on transistor 20 can be prevented.

Since the former stage of the gate driver circuit 90 has high impedance, the gate control signal can easily be inverted.

As described above, according to the present embodiment, the protection circuit is formed, whereby a semiconductor device having increased resistance to serge voltage and enhanced reliability can be realized. In addition, a degree of freedom of design of the first resistance element 50 is increased, and the suppression of a switching loss can be realized.

Sixth Embodiment

A semiconductor device according to the present embodiment is similar to that in the fifth embodiment except for further including a PN diode having a fourth anode connected to a first gate terminal, a protection element, and an input unit of a gate driver circuit. Therefore, the description overlapping with the fifth embodiment will not be repeated.

Figure 12:
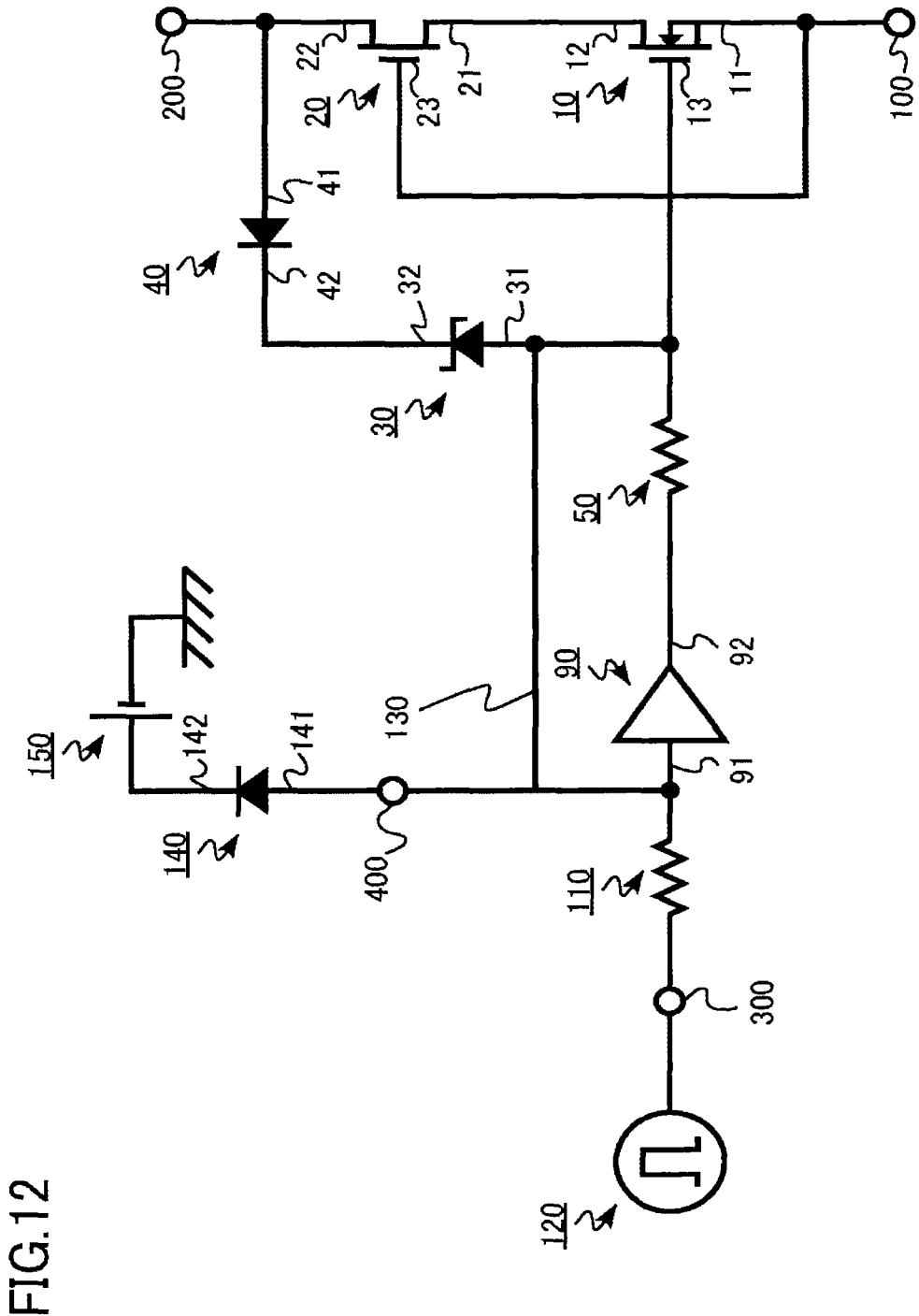
FIG. 12 is a circuit diagram of a semiconductor device according to a sixth embodiment.

FIG. 12 is a circuit diagram of a semiconductor device according to the present embodiment.

The semiconductor device according to the present embodiment includes a discharge terminal 400. The discharge terminal 400 is connected to a first gate terminal 13, a protection element 30, and an input unit 91 of a gate driver circuit 90. The discharge terminal 400 is also connected to a power supply 150 via a PN diode (fourth diode) 140.

The PN diode 140 includes an anode (fourth anode) 141 and a cathode (fourth cathode) 142. The anode 141 is connected to the discharge terminal 400. The cathode 142 is connected to the power supply 150.

The present embodiment prevents voltage of the former stage of the gate driver circuit 90 from increasing more than voltage of the power supply due to the discharge from the discharge terminal 400 to the power supply. Accordingly, the application of voltage equal to or higher than voltage necessary for inverting the gate control signal to the gate driver circuit 90 is prevented, whereby the gate driver circuit 90 is protected. Consequently, a semiconductor device with more enhanced reliability than the semiconductor device according to the fifth embodiment can be realized.

(First Modification)

A semiconductor device according to a first modification of the sixth embodiment is similar to that in the sixth embodiment except for further including a zener diode having a fifth cathode connected to the first gate terminal, the protection element, and the input unit of the gate driver circuit.

Figure 13:
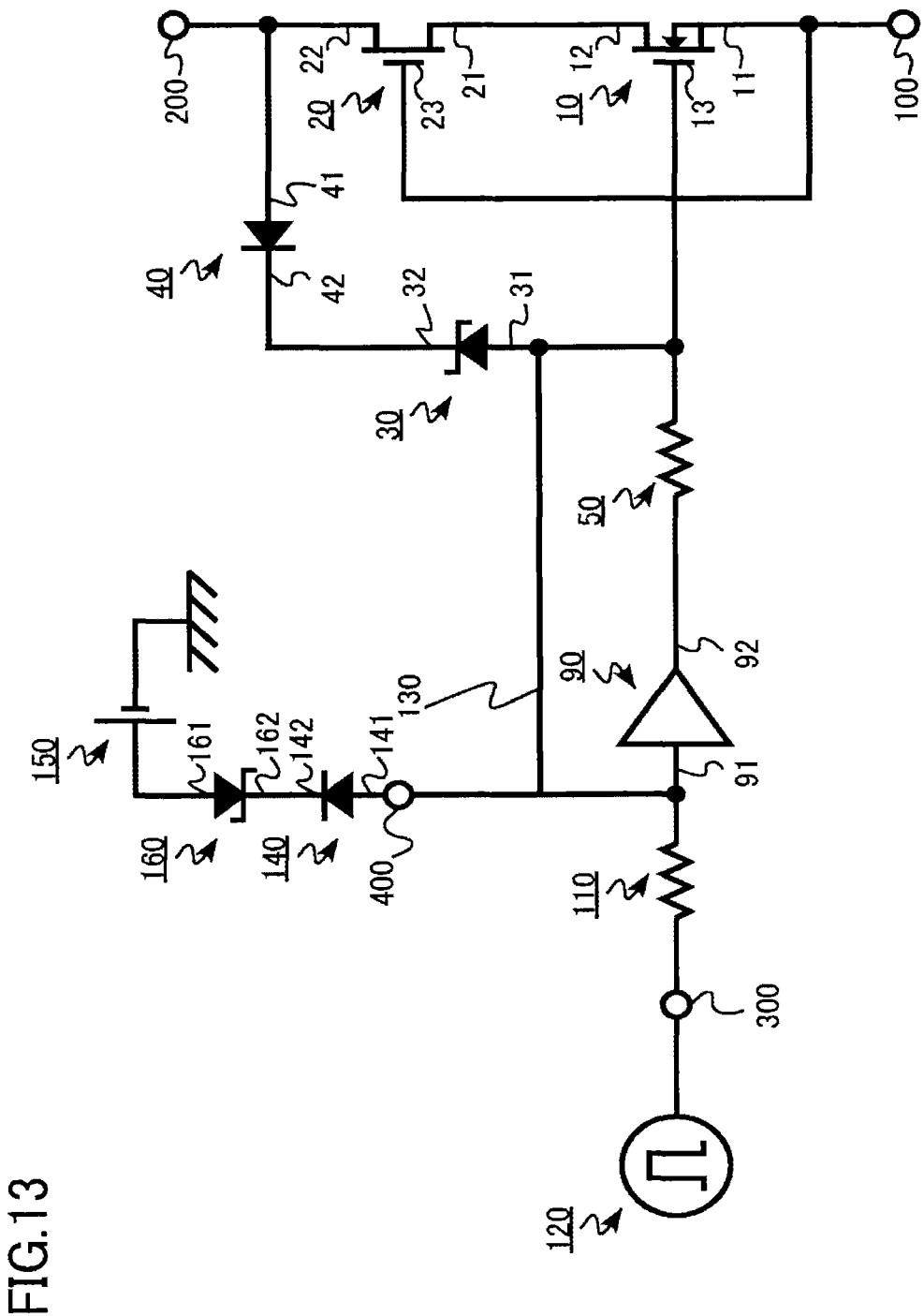
FIG. 13 is a circuit diagram of a semiconductor device according to a first modification of the sixth embodiment.

FIG. 13 is a circuit diagram of a semiconductor device according to the first modification of the present embodiment.

The semiconductor device according to the present modification includes a discharge terminal 400. The discharge terminal 400 is connected to the first gate terminal 13, the protection element 30, and the input unit 91 of the gate driver circuit 90. The discharge terminal 400 is also connected to the power supply 150 via the PN diode (fourth diode) 140 and a zener diode (fifth diode) 160.

The zener diode 160 includes an anode (fifth anode) 161 and a cathode (fifth cathode) 162. The cathode 162 is connected to a cathode 142 of the PN diode 140. The anode 161 is connected to the power supply 150.

According to the present modification, voltage of the former stage of the gate driver circuit 90 increases up to the zener voltage+power supply voltage, but the further increase is prevented due to the discharge from the discharge terminal 400. Accordingly, voltage higher than the voltage in the sixth embodiment can be applied to the former stage of the gate driver circuit 90 with excellent controllability.

(Second Modification)

A semiconductor device according to a second modification of the sixth embodiment is similar to that in the sixth embodiment except for further including a zener diode having a fifth cathode connected to the discharge terminal 400, instead of the PN diode, the zener diode being grounded.

Figure 14:
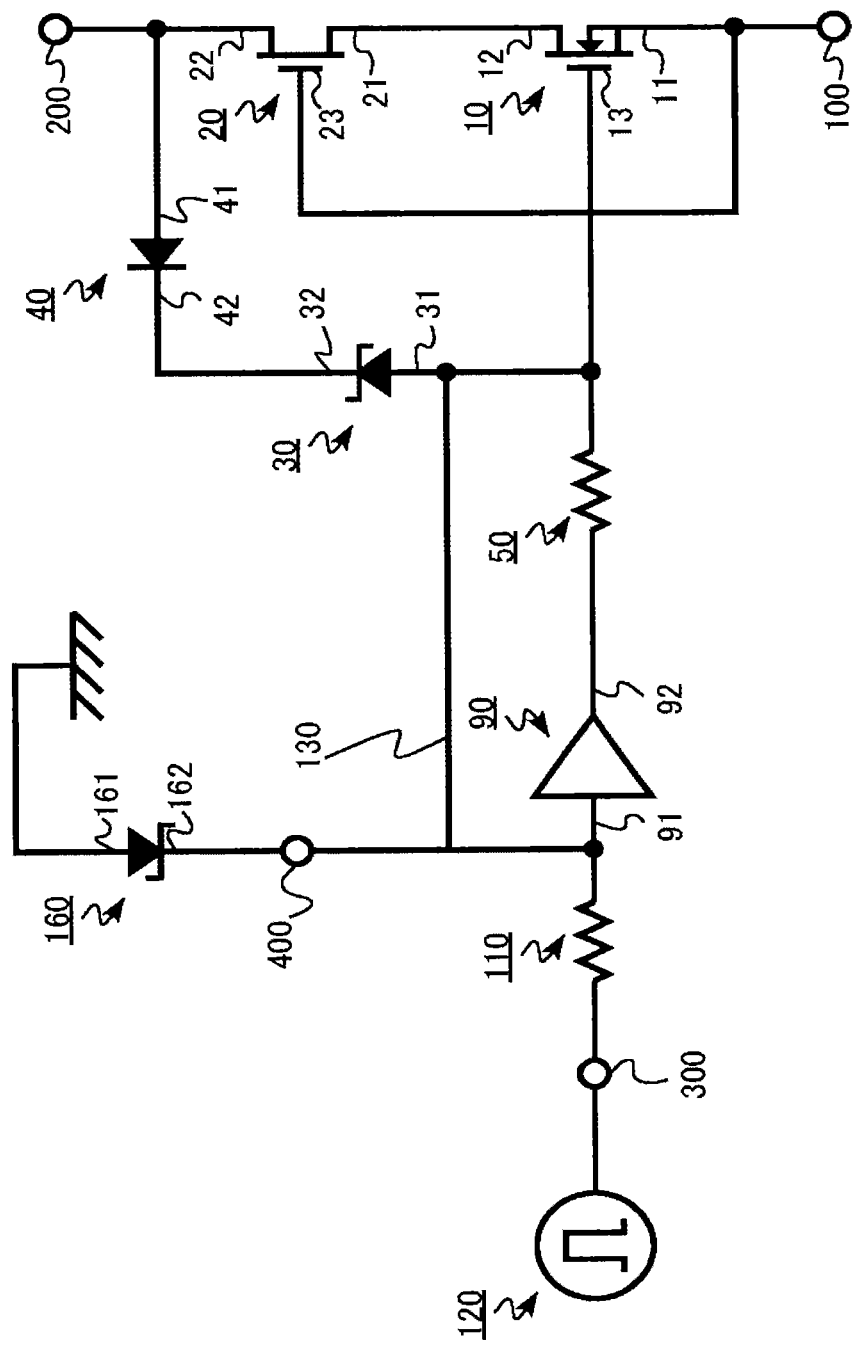
FIG. 14 is a circuit diagram of a semiconductor device according to a second modification of the sixth embodiment.

FIG. 14 is a circuit diagram of a semiconductor device according to the second modification of the present embodiment.

The semiconductor device according to the present modification includes a discharge terminal 400. The discharge terminal 400 is connected to the first gate terminal 13, the protection element 30, and the input unit 91 of the gate driver circuit 90. The discharge terminal 400 is also grounded via the zener diode (fifth diode) 160.

The zener diode 160 includes an anode (fifth anode) 161 and a cathode (fifth cathode) 162. The cathode 162 is connected to the discharge terminal 400. The anode 161 is connected to the ground.

According to the present modification, voltage of the former stage of the gate driver circuit 90 increases up to the zener voltage, but the further increase is prevented due to the discharge from the discharge terminal 400. Accordingly, voltage applied to the former stage of the gate driver circuit 90 can be controlled to be desired voltage determined by the zener voltage.

Seventh Embodiment

A semiconductor device according to seventh embodiment is similar to that in the fifth embodiment except for further including a third resistance element provided between an input unit of a gate driver circuit and both a first gate terminal and a protection element; and a fourth resistance element provided between the protection element and the first gate terminal. Therefore, the description overlapping with the fifth embodiment will not be repeated.

Figure 15:
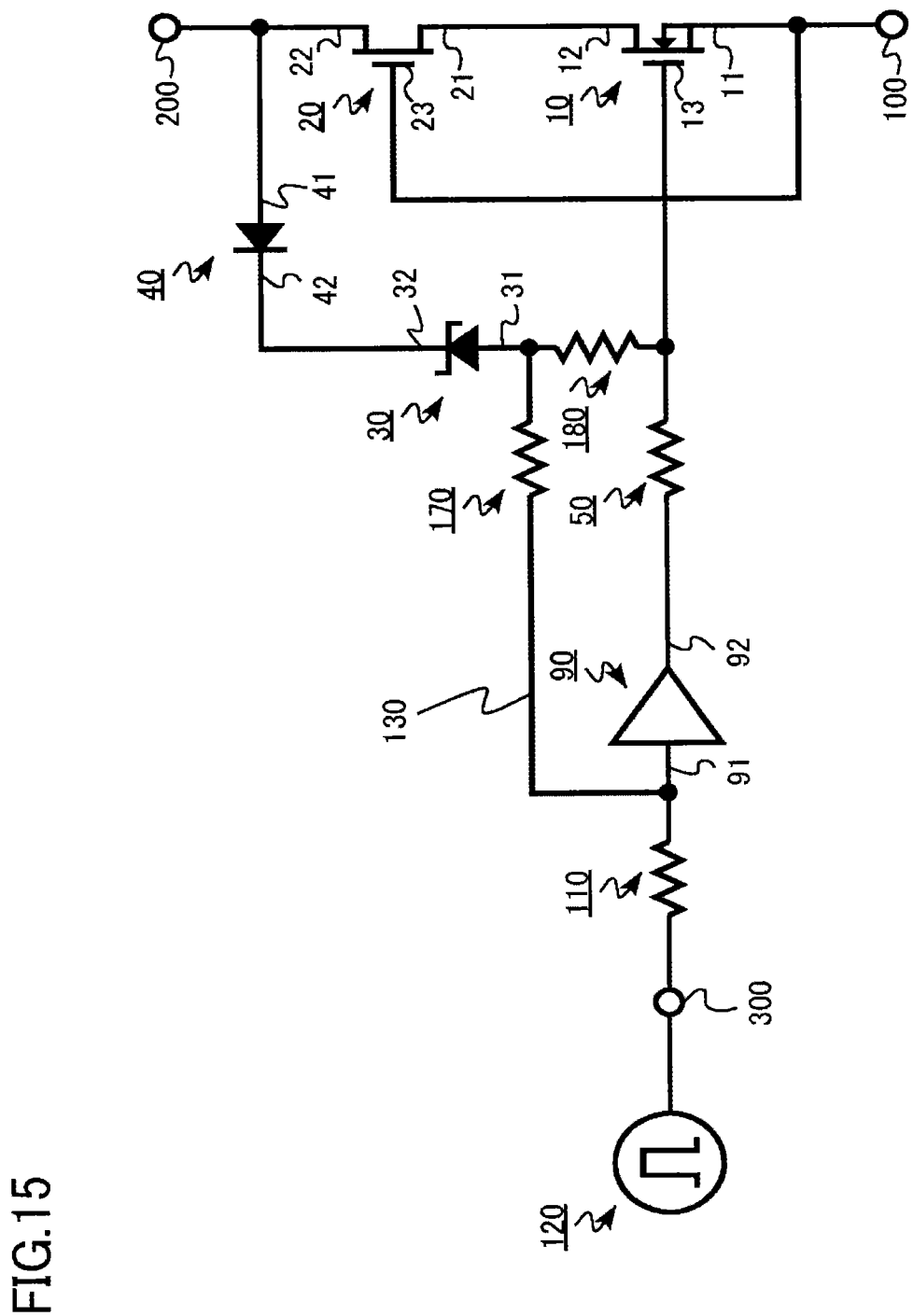
FIG. 15 is a circuit diagram of a semiconductor device according to a seventh embodiment.

FIG. 15 is a circuit diagram of a semiconductor device according to the present embodiment. The semiconductor device according to the present embodiment includes a third resistance element 170 provided between an input unit 91 of a gate driver circuit 90 and both a first gate terminal 13 and a protection element 30. The semiconductor device according to the present embodiment also includes a fourth resistance element 180 provided between the protection element 30 and the first gate terminal 13.

The semiconductor device according to the present embodiment adjusts resistance values of the third resistance element 170 and the fourth resistance element 180, thereby being capable of adjusting distribution of serge voltage (serge energy), and an absorption amount and absorption speed of the serge voltage. Accordingly, a semiconductor device with more enhanced reliability than the semiconductor device according to the fifth embodiment can be realized.

A configuration in which either one of the third resistance element 170 and the fourth resistance element 180 is provided may be employed.

Eighth Embodiment

A semiconductor device according to an eighth embodiment is similar to that in the fifth embodiment except that a gate driver circuit and a second resistance element are provided outside a power module. Therefore, the description overlapping with the fifth embodiment will not be repeated.

Figure 16:
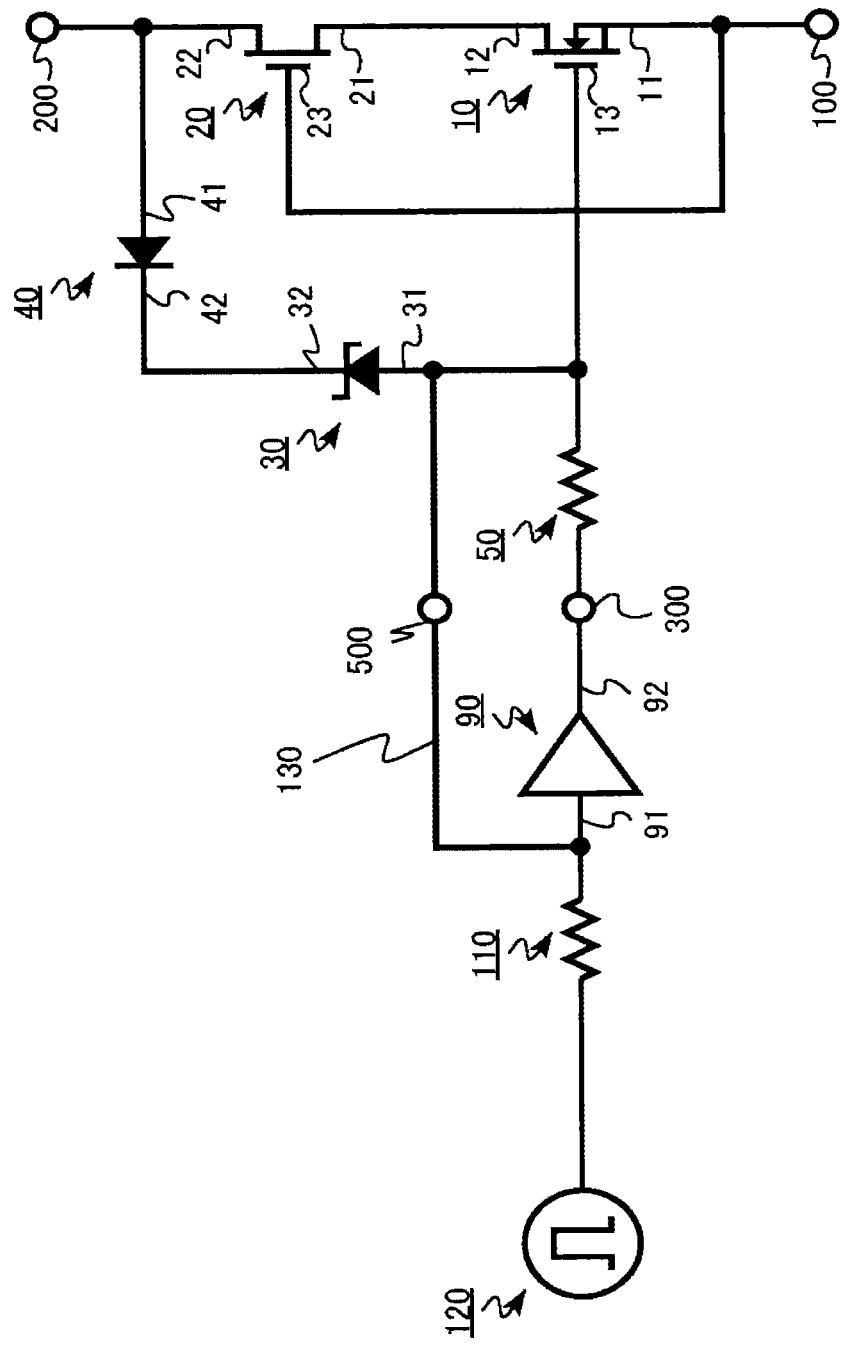
FIG. 16 is a circuit diagram of a semiconductor device according to an eighth embodiment.

FIG. 16 is a circuit diagram of a semiconductor device according to the present embodiment.

The semiconductor device according to the present embodiment includes a bypass electrode terminal 500, a gate driver circuit 90, and a second resistance element 110. A source electrode terminal 100, a drain electrode terminal 200, a gate electrode terminal 300, and the bypass terminal 500 are electrode terminals of a power module functioning as a normally-off transistor.

The gate driver circuit 90 is provided outside the power module, and includes an input unit 91 and an output unit 92. A gate signal input unit 120 is connected at the side of the input unit 91. The gate electrode terminal 300 is connected to the output unit 92 of the gate driver circuit 90.

The second resistance element 110 is provided between the gate signal input unit 120 and the gate driver circuit 90. One end of the second resistance element 110 is connected to the gate signal input unit 120, while the other end is connected to the input unit 91 of the gate driver circuit 90.

The second resistance element 110 is a so-called damping element having a function of suppressing wringing. The second resistance element 110 has resistance higher than the first resistance element 50.

The output unit 92 of the gate driver circuit 90 is connected to the first resistance element 50. The first gate terminal 13 and the protection element 30 are connected to the input unit 91 of the gate driver circuit 90 by a bypass line 130 via the bypass electrode terminal 500. The second resistance element 110 is connected to the first gate terminal 13 and the protection element 30 by the bypass line 130 and the bypass electrode terminal 500.

A circuit other than the gate driver circuit 90, such as a level shift circuit, may be provided between the gate signal input unit 120 and the first resistance element 50.

As in the fifth embodiment, according to the present embodiment, the protection circuit is formed, whereby a semiconductor device having increased resistance to serge voltage and enhanced reliability can be realized. In addition, a degree of freedom of design of the first resistance element 50 is increased, and the suppression of a switching loss can be realized.

Ninth Embodiment

A semiconductor device according to a ninth embodiment is similar to that in the eighth embodiment except for further including a PN diode having a fourth anode connected to a first gate terminal, a protection element, and an input unit of a gate driver circuit. Therefore, the description overlapping with the eighth embodiment will not be repeated.

Figure 17:
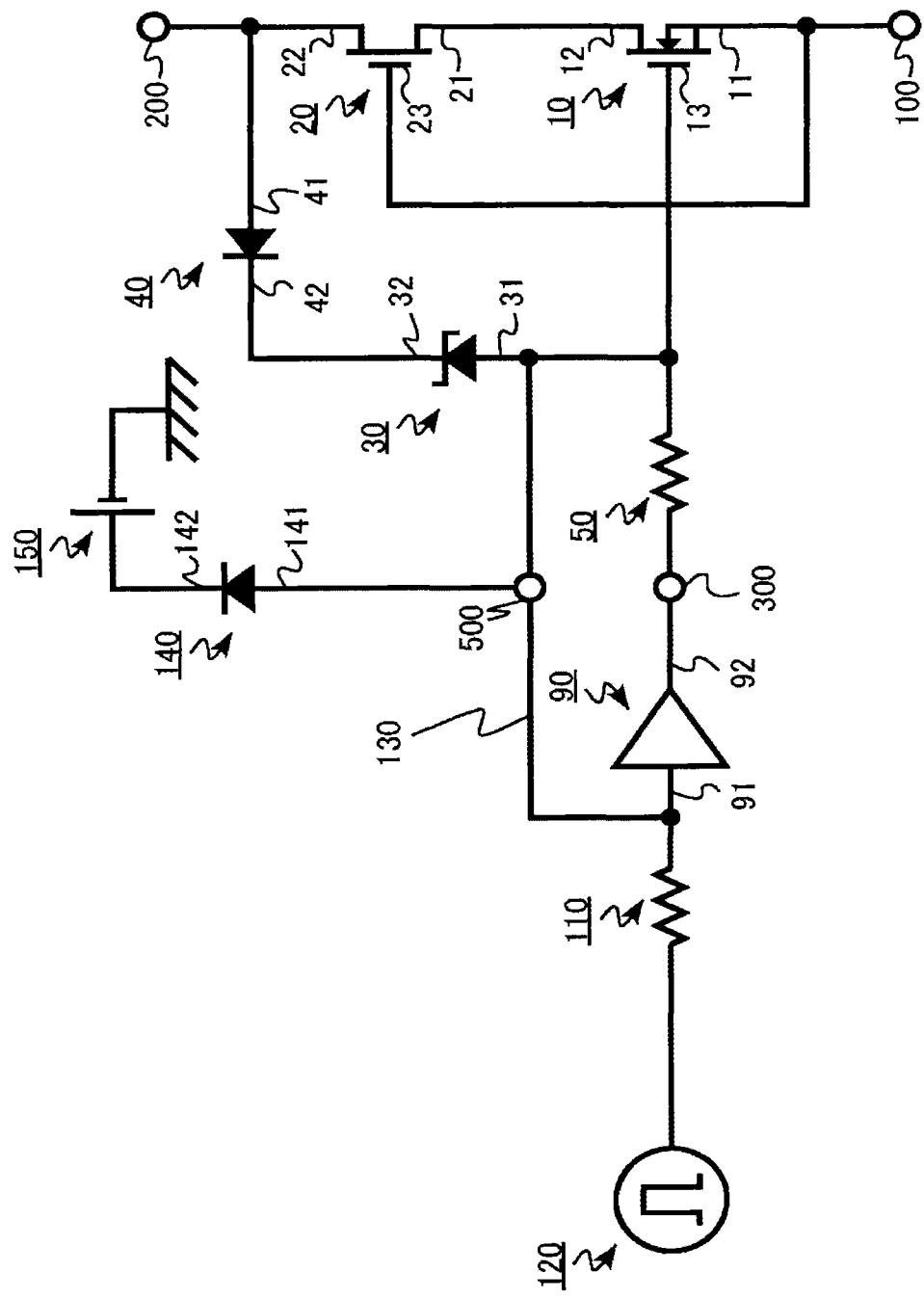
FIG. 17 is a circuit diagram of a semiconductor device according to a ninth embodiment.

FIG. 17 is a circuit diagram of a semiconductor device according to the present embodiment.

In the present embodiment, a bypass terminal 500 is connected to a power supply 150 via a PN diode (fourth diode) 140.

The PN diode 140 includes an anode (fourth anode) 141 and a cathode (fourth cathode) 142. The anode 141 is connected to a discharge terminal 400. The cathode 142 is connected to the power supply 150.

The present embodiment prevents voltage of the former stage of the gate driver circuit 90 from increasing more than voltage of the power supply due to the discharge from the bypass terminal 500 to the power supply. Accordingly, the application of voltage equal to or higher than voltage necessary for inverting the gate control signal to the gate driver circuit 90 is prevented, whereby the gate driver circuit 90 is protected. Consequently, a semiconductor device with more enhanced reliability than the semiconductor device according to the fifth embodiment can be realized.

(First Modification)

A semiconductor device according to a first modification of the ninth embodiment is similar to that in the ninth embodiment except for further including a zener diode having a fifth cathode connected to the bypass terminal 500.

Figure 18:
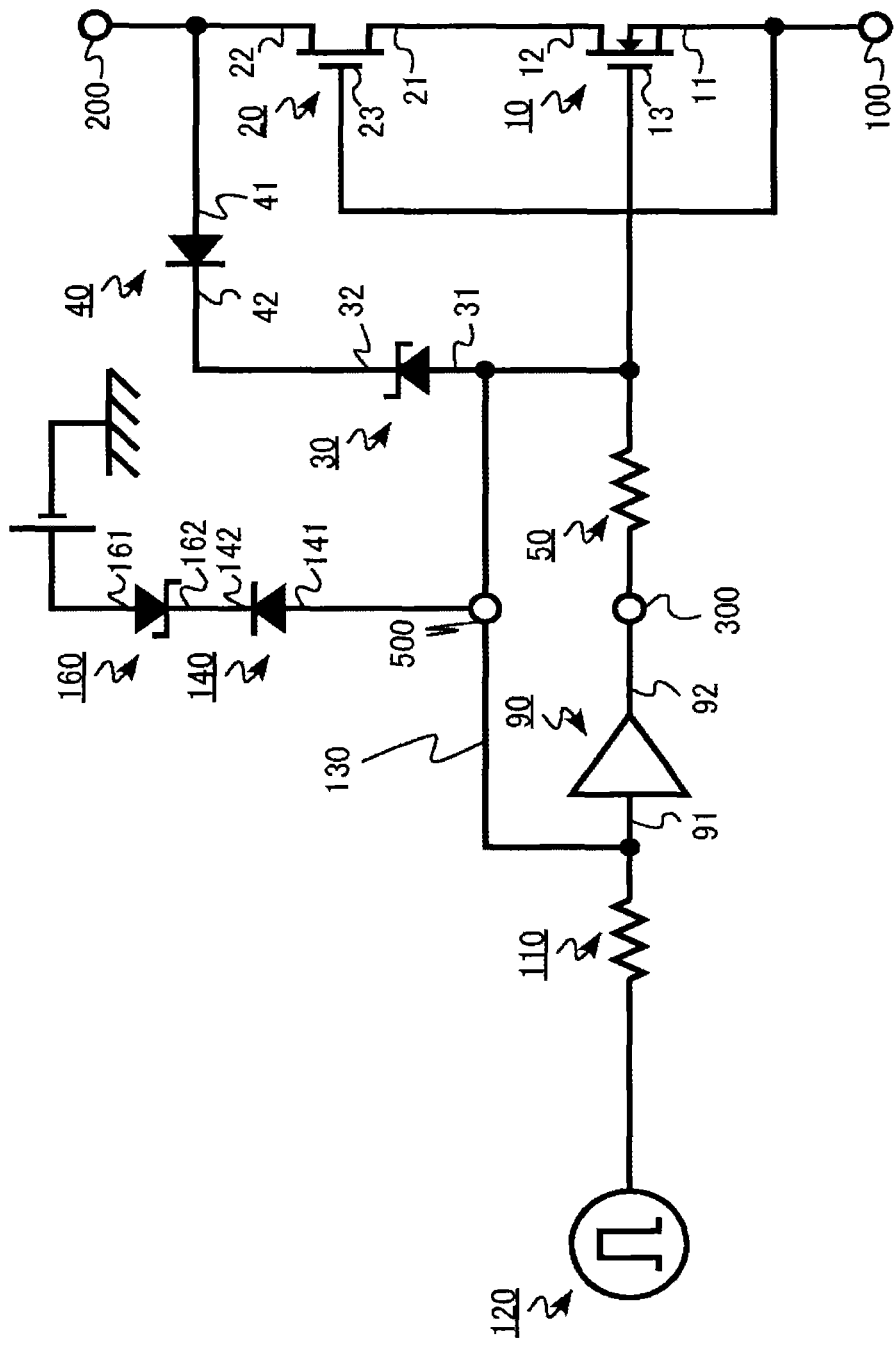
FIG. 18 is a circuit diagram of a semiconductor device according to a first modification of the ninth embodiment.

FIG. 18 is a circuit diagram of a semiconductor device according to the first modification of the present embodiment.

The bypass terminal 500 is connected to the first gate terminal 13, the protection element 30, and the input unit 91 of the gate driver circuit 90. The bypass terminal 500 is also connected to the power supply 150 via the PN diode (fourth diode) 140 and a zener diode (fifth diode) 160.

The zener diode 160 includes an anode (fifth anode) 161 and a cathode (fifth cathode) 162. The cathode 162 is connected to a cathode 142 of the PN diode 140. The anode 161 is connected to the power supply 150.

According to the present modification, voltage of the former stage of the gate driver circuit 90 increases up to the zener voltage+power supply voltage, but the further increase is prevented due to the discharge from the bypass terminal 500. Accordingly, voltage higher than the voltage in the ninth embodiment can be applied to the former stage of the gate driver circuit 90 with excellent controllability.

(Second Modification)

A semiconductor device according to a second modification of the ninth embodiment is similar to that in the ninth embodiment except for further including a zener diode having a fifth cathode connected to the bypass terminal 500, instead of the PN diode, the zener diode being grounded.

Figure 19:
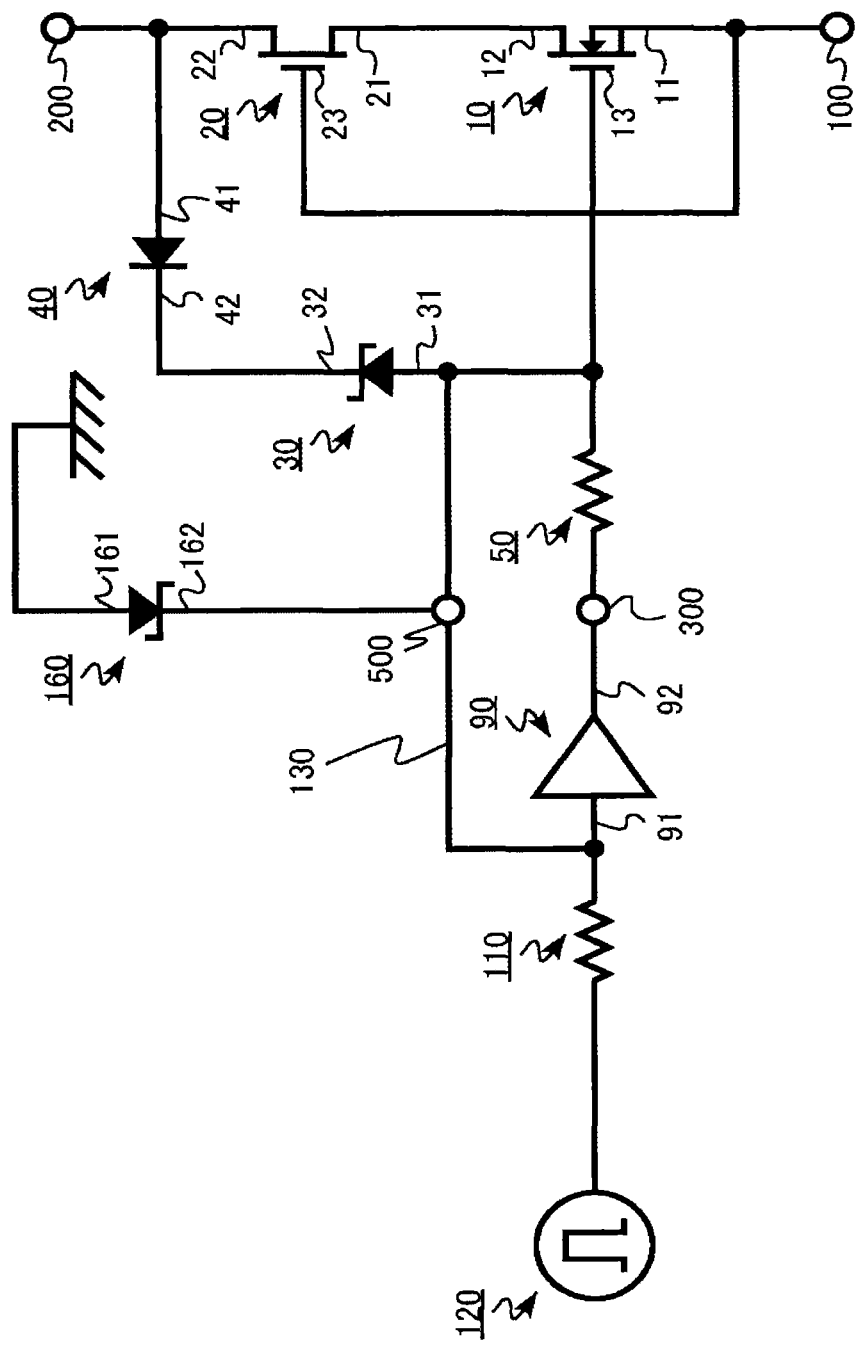
FIG. 19 is a circuit diagram of a semiconductor device according to a second modification of the ninth embodiment.

FIG. 19 is a circuit diagram of a semiconductor device according to the second modification of the present embodiment.

The semiconductor device according to the present modification includes a bypass terminal 500. The bypass terminal 500 is connected to the first gate terminal 13, the protection element 30, and the input unit 91 of the gate driver circuit 90. The bypass terminal 500 is also grounded via the zener diode (fifth diode) 160.

The zener diode 160 includes an anode (fifth anode) 161 and a cathode (fifth cathode) 162. The cathode 162 is connected to the bypass terminal 500. The anode 161 is connected to the ground.

According to the present modification, voltage of the former stage of the gate driver circuit 90 increases up to the zener voltage, but the further increase is prevented due to the discharge from the bypass terminal 500. Accordingly, voltage applied to the former stage of the gate driver circuit 90 is controlled to be desired voltage determined by the zener voltage.

Tenth Embodiment

A semiconductor device according to a tenth embodiment is similar to that in the eighth embodiment except for further including a third resistance element provided between an input unit of a gate driver circuit and both a first gate terminal and a protection element; and a fourth resistance element provided between the protection element and the first gate terminal. Therefore, the description overlapping with the eighth embodiment will not be repeated.

Figure 20:
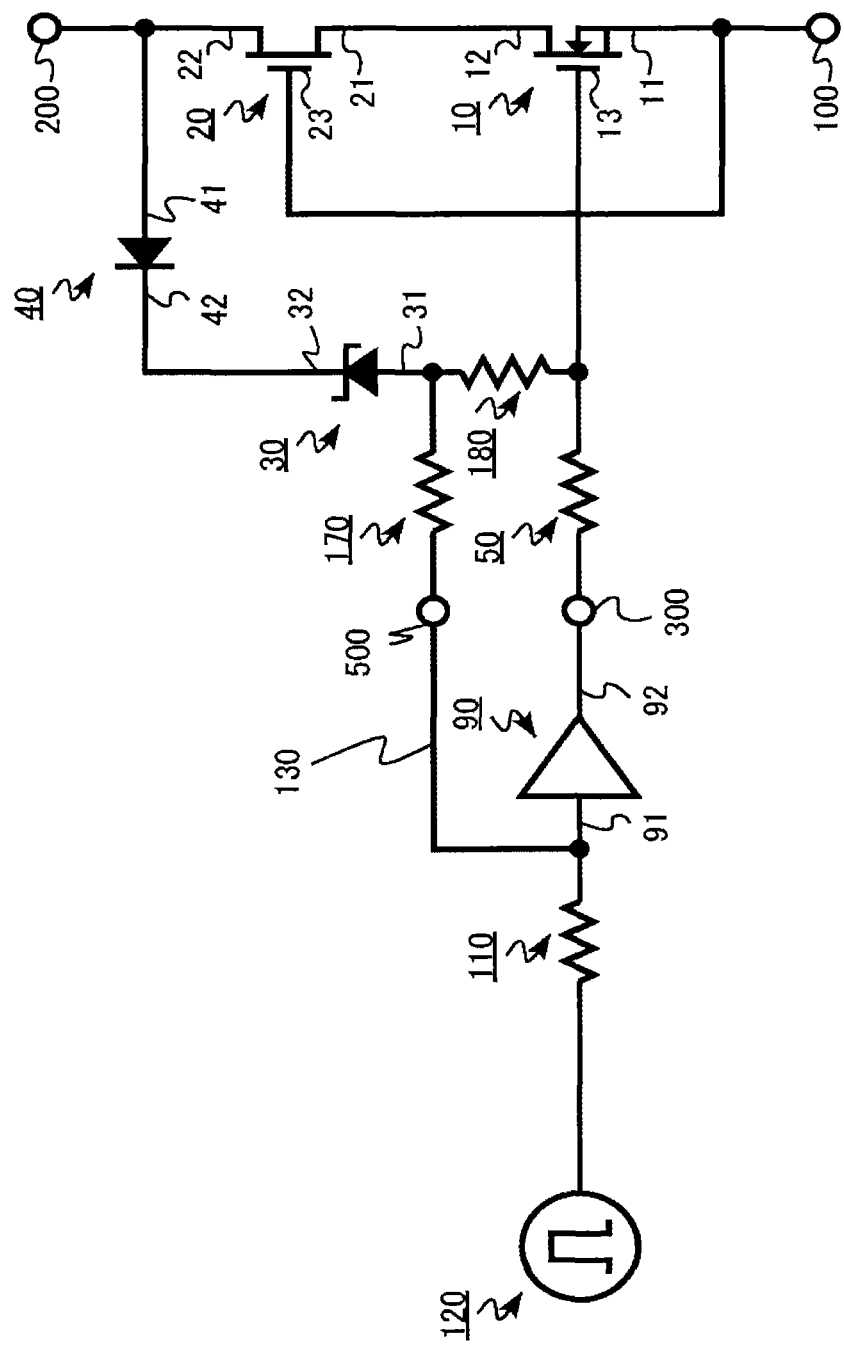
FIG. 20 is a circuit diagram of a semiconductor device according to a tenth embodiment.

FIG. 20 is a circuit diagram of a semiconductor device according to the present embodiment. The semiconductor device according to the present embodiment includes a third resistance element 170 provided between a bypass terminal 500 and both a first gate terminal 13 and a protection element 30. The semiconductor device according to the present embodiment also includes a fourth resistance element 180 provided between the protection element 30 and the first gate terminal 13.

The semiconductor device according to the present embodiment adjusts resistance values of the third resistance element 170 and the fourth resistance element 180, thereby being capable of adjusting distribution of serge voltage (serge energy), and an absorption amount and absorption speed of the serge voltage. Accordingly, a semiconductor device with more enhanced reliability than the semiconductor device according to the eighth embodiment can be realized.

A configuration in which either one of the third resistance element 170 and the fourth resistance element 180 is provided may be employed.

As described above, according to the present embodiment, the protection circuit is formed, whereby a semiconductor device having increased resistance to serge voltage and enhanced reliability can be realized. In addition, when excess voltage is generated on the drain of the normally-off transistor, charges can be released, whereby reliability is further enhanced.

The embodiments use a GaN semiconductor HEMT as one example of the normally-on transistor 20. However, a normally-on SiC (silicon carbide) JFET (Junction Field Effect Transistor) can also be employed.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:
1. A semiconductor device comprising:
  a first normally-off transistor including a first source terminal, a first drain terminal, and a first gate terminal;

a normally-on transistor including a second source terminal connected to the first drain terminal, a second drain terminal, and a second gate terminal connected to the first source terminal;

a protection element provided between the first gate terminal and the second drain terminal, the protection element having breakdown voltage lower than breakdown voltage of the normally-on transistor; and a first diode including a first anode connected to the second drain terminal and a first cathode connected to the protection element.

2. The device according to claim 1, wherein
the protection element is a second diode including a second anode connected to the first gate terminal and a second cathode connected to the first cathode.

3. The device according to claim 2, wherein
the second diode is a zener diode.

4. The device according to claim 1, wherein
the protection element is a second normally-off transistor including a third source terminal connected to the first gate terminal, a third drain terminal connected to the first cathode, and a third gate terminal.

5. The device according to claim 1, wherein
breakdown voltage of the first diode is higher than breakdown voltage of the normally-on transistor.

6. The device according to claim 1, wherein
the first diode is a zener diode.

7. The device according to claim 1, further comprising:
a zener diode including a third anode connected to the first source terminal and a third cathode connected to the first drain terminal.

8. The device according to claim 1, further comprising:
a first resistance element having one end connected to the protection element and the first gate terminal.

9. The device according to claim 1, wherein
the normally-on transistor is a GaN semiconductor HEMT.

10. The device according to claim 1, wherein
the normally-on transistor is a SiC semiconductor JFET.

11. The device according to claim 8, further comprising:
a gate driver circuit including an output unit and an input unit, the output unit being connected to the first resistance element, the input unit being connected to the first gate terminal and the protection element.

12. The device according to claim 11, further comprising:
a second resistance element having one end connected to the input unit, the first gate terminal, and the protection element, the second resistance having resistance higher than resistance of the first resistance element.

13. The device according to claim 11, further comprising:
a PN diode including a fourth anode connected to the first gate terminal, the protection element, and the input unit.

14. The device according to claim 11, further comprising:
a zener diode including a fifth cathode connected to the first gate terminal, the protection element, and the input unit.

15. The device according to claim 11, further comprising:
a third resistance element provided between the input unit and both the first gate terminal and the protection element.

16. The device according to claim 11, further comprising:
a fourth resistance element provided between the protection element and the first gate terminal.

* * * * *